(12) United States Patent
Sakamoto

(10) Patent No.: US 6,776,862 B2
(45) Date of Patent: Aug. 17, 2004

(54) MULTILAYERED CERAMIC BOARD, METHOD FOR FABRICATING THE SAME, AND ELECTRONIC DEVICE USING MULTILAYERED CERAMIC BOARD

(75) Inventor: Sadaaki Sakamoto, Koka-gun (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/942,461

(22) Filed: Aug. 29, 2001

(65) Prior Publication Data

US 2002/0048666 A1 Apr. 25, 2002

(30) Foreign Application Priority Data

Sep. 7, 2000 (JP) ........................................ 2000-271322

(51) Int. Cl.[7] .............................................. B32B 31/26
(52) U.S. Cl. .................................. 156/89.12; 156/89.12
(58) Field of Search ........................... 156/89.12, 89.16, 156/289; 264/614, 619, 652

(56) References Cited

U.S. PATENT DOCUMENTS

| 4,621,066 A | * | 11/1986 | Nishigaki et al. |
| 4,726,921 A | * | 2/1988 | Nishigaki et al. |
| 4,853,349 A | * | 8/1989 | Martin |
| 5,254,191 A | | 10/1993 | Mikeska et al. |
| 5,370,759 A | * | 12/1994 | Hakotani et al. |
| 5,387,474 A | | 2/1995 | Mikeska et al. |
| 5,456,778 A | * | 10/1995 | Fukuta et al. |
| 5,468,694 A | * | 11/1995 | Taguchi et al. ............... 501/177 |
| 5,474,741 A | | 12/1995 | Mikeska et al. |
| 5,958,807 A | * | 9/1999 | Kumar et al. |
| 6,042,667 A | * | 3/2000 | Adachi et al. |
| 6,232,251 B1 | * | 5/2001 | Terashi et al. |
| 6,444,598 B1 | * | 9/2002 | Kawakami et al. |
| 2002/0027282 A1 | * | 3/2002 | Kawakami et al. |

FOREIGN PATENT DOCUMENTS

JP 2000-128628 * 5/2000

* cited by examiner

Primary Examiner—Melvin C. Mayes
(74) Attorney, Agent, or Firm—Dickstein, Shapiro, Morin & Oshinsky, LLP.

(57) ABSTRACT

A method for fabricating a multilayered ceramic board includes forming a green laminate, the green laminate including a plurality of green base layers containing a low-temperature sinterable ceramic material which is a ceramic powder and a glass component, and a binder; at least one green constraining layer disposed in contact with a principal surface of a specific green base layer, the green constraining layer containing an inorganic material powder which is not sintered at the sintering temperature of the low-temperature sinterable ceramic material; and wiring conductors; and firing the green laminate at the sintering temperature of the low-temperature sinterable ceramic material. The firing step includes a binder removal step and a sintering step for obtaining the sintered state of the low-temperature sinterable ceramic material in which the ceramic powder is densified while the glass component is fluidized. The rate of temperature increase from the binder removal step to the sintering step is set to be more than about ° C./minute.

10 Claims, 1 Drawing Sheet

MULTILAYERED CERAMIC BOARD, METHOD FOR FABRICATING THE SAME, AND ELECTRONIC DEVICE USING MULTILAYERED CERAMIC BOARD

BACKGROUND OF THE INVENTION

1. Field of the Invention

The present invention relates to multilayered ceramic boards, methods for fabricating the same, and electronic devices using such multilayered ceramic boards. More particularly, the invention relates to improvements in densification of a multilayered ceramic board fabricated by a so-called "non-shrinkage process"

2. Description of the Related Art

A multilayered ceramic board includes a plurality of ceramic layers which are laminated. Various wiring conductors are provided on the multilayered ceramic board. As the wiring conductors, for example, internal conductive films extending along specific interfaces between the ceramic layers are formed in the multilayered ceramic board; via-hole conductors extending so as to pass through specific ceramic layers are formed; and external conductive films extending on the external surfaces of the multilayered ceramic board are formed.

Multilayered ceramic boards are used for interconnecting semiconductor chip components and other chip components mounted thereon. Wiring conductors as described above serve as the electrical paths for the interconnections.

Passive elements, such as capacitors and inductors, may be built in multilayered ceramic boards. In such a case, the passive elements are formed by parts of the internal conductive films and via-hole conductors which are the wiring conductors.

For example, multilayered ceramic boards are used as high-frequency LCR composite parts in the field of mobile communication terminal equipment. In the field of computers, multilayered ceramic boards are used as composite parts including active elements, such as semiconductor IC chips, and passive elements, such as capacitors, inductors and resistors, or simply used as semiconductor IC packages.

Multilayered ceramic boards are widely used for forming various electronic components, such as PA module boards, RF diode switches, filters, chip antennas, various package components, and composite devices.

In order to increase the level of functionality, the density and the performance of multilayered ceramic boards, it is effective to dispose wiring conductors as described above at a high density. However, a firing step must be carried out in order to fabricate a multilayered ceramic board. In such a firing step, shrinkage occurs due to sintering of the ceramic, and the shrinkage tends to be nonuniform over the entire multilayered ceramic board, resulting in undesired deformation and strain in wiring conductors. Such deformation and strain occurring in the wiring conductors inhibit an increase in the density of the wiring conductors.

Therefore, use of a so-called "non-shrinkage process" has been proposed, in which shrinkage in the principal surface direction of the multilayered ceramic board is substantially prevented in the firing step when a multilayered ceramic board is fabricated.

In the fabrication method of a multilayered ceramic board using the non-shrinkage process, a low-temperature sinterable ceramic material which can be sintered, for example, at a temperature of about 1,000° C. or less is prepared, and simultaneously an inorganic material powder which is not sintered at the sintering temperature of the low-temperature sinterable ceramic material and which inhibits shrinkage is prepared. When a green laminate for forming the predetermined multilayered ceramic board is fabricated, a plurality of green base layers containing the low-temperature sinterable material are laminated, and the green constraining layers containing the inorganic material powder are disposed so as to be in contact with the principal surfaces of specific green base layers. Wiring conductors are also provided on the green base layers.

The green laminate thus obtained is then fired. In the firing step, a substantial shrinkage does not occur in the green constraining layers since the inorganic material contained in the green constraining layers is not substantially sintered. Consequently, the green constraining layers constrain the green base layers, and thereby, although the green base layers substantially shrink only in the thickness direction, shrinkage in the principal surface direction is inhibited. As a result, nonuniform deformation does not easily occur in the multilayered ceramic board which is obtained by firing the green laminate, and thereby, it is possible to prevent undesired deformation and strain in the wiring conductors, enabling an increase in the density of the wiring conductors.

The green base layers contain the low-temperature sinterable ceramic material and a binder. The low-temperature sinterable ceramic material contains a ceramic powder and a glass component. The glass component contained in the low-temperature sinterable ceramic material may be contained as a glass powder from the beginning or a glass substance may be precipitated in the firing step. In some cases, the glass component may precipitate a crystalline substance in at least the final stage of the firing step, and thereby is crystallized.

At any rate, a dense state must be produced in the ceramic layers obtained by firing the green base layers. For that purpose, the ceramic powder contained in the green base layers must be densified, and in order to density the ceramic powder, it is important that the fluidity of the glass component is ensured in the firing step.

However, as described above, since the green base layers are constrained by the green constraining layers so that the green base layers substantially shrink only in the thickness direction, the fluidity of the glass component tends to be inhibited. For this reason, it is important that the fluidity of the glass component is ensured.

When the glass component which precipitates the crystalline substance in at least the final stage of the firing step is contained in the low-temperature sinterable ceramic material, the viscosity of the glass component increases as the crystalline substance is precipitated, and as a result, fluidity of the glass component is lost. Therefore, the densification of the ceramic powder does not easily advance.

SUMMARY OF THE INVENTION

Accordingly, objects of the present invention are to provide a method for fabricating a multilayered ceramic board using a so-called "non-shrinkage process" in which dense ceramic layers can be formed, to provide a multilayered ceramic board fabricated by such a method, and to provide an electronic device using the multilayered ceramic board.

In one aspect of the present invention, a method for fabricating a multilayered ceramic board includes a lamination step for forming a green laminate, the green laminate including a plurality of green base layers containing a low-temperature sinterable ceramic material comprising a ceramic powder and a glass component, and a binder; at least one green constraining layer disposed in contact with a principal surface of a specific green base layer, the green constraining layer containing an inorganic material powder which is not sintered at the sintering temperature for the low-temperature sinterable ceramic material; and wiring conductors provided on the green base layers; and a firing step for firing the green laminate at the sintering temperature for the low-temperature sinterable ceramic material. The firing step includes a binder removal step for removing the binder contained in the green base layers and a sintering step for obtaining the sintered state of the low-temperature sinterable ceramic material in which the ceramic powder is densified while the glass component is fluidized in the green base layers. In order to solve the technical problems described above, the rate of temperature increase from the binder removal step to the sintering step is set to be more than about 20° C./minute.

In another aspect of the present invention, a glass component contained in a low-temperature sinterable ceramic material in a method for fabricating a multilayered ceramic board, can precipitate a crystalline substance, and in the firing step, the rate of temperature increase is controlled so that the glass component precipitates the crystalline substance after a ceramic powder is densified.

In the method for fabricating a multilayered ceramic board of the present invention, when the green constraining layers are disposed on both ends in the lamination direction of the laminate, the green constraining layers located on both ends in the lamination direction of the laminate may be removed after the firing step is carried out.

The method for fabricating a multilayered ceramic board of the present invention may further include a step of mounting an electronic component on an external surface of the laminate after the firing step is carried out.

In another aspect of the present invention, a multilayered ceramic board is fabricated by the fabrication method described above.

In another aspect of the present invention, an electronic device includes the multilayered ceramic board and a motherboard for fixing the multilayered ceramic board.

As described above, in accordance with the present invention, when a multilayered ceramic board is fabricated, since the co-called "non-shrinkage process" is employed, although fluidity of the glass component contained in the green base layers tends to be inhibited because of the constraint of the green constraining layers, since the rate of temperature increase is set to be more than about 20° C./minute, the glass component can be fluidized at a relatively early stage and the fluid state of the glass component can be sufficiently prolonged. As a result, the ceramic powder contained in the green base layers starts to be densified at a relatively early stage, and thereby it is possible to obtain a satisfactorily dense state in the ceramic layers produced by firing the green base layers.

When the glass component contained in the green base layer can precipitate a crystalline substance, the ceramic powder can be thoroughly densified before the crystalline substance is precipitated and the fluidity of the glass component is lost. Consequently, the ceramic layers obtained can be satisfactorily densified.

Accordingly, the multilayered ceramic board fabricated by the fabrication method of the present invention can provide superior electrical characteristics and reliability.

Therefore, if an electronic device is fabricated by mounting the multilayered ceramic board on a motherboard, the electrical characteristics and reliability of the electronic device can also be improved.

DESCRIPTION OF THE PREFERRED EMBODIMENTS

Figure 1:
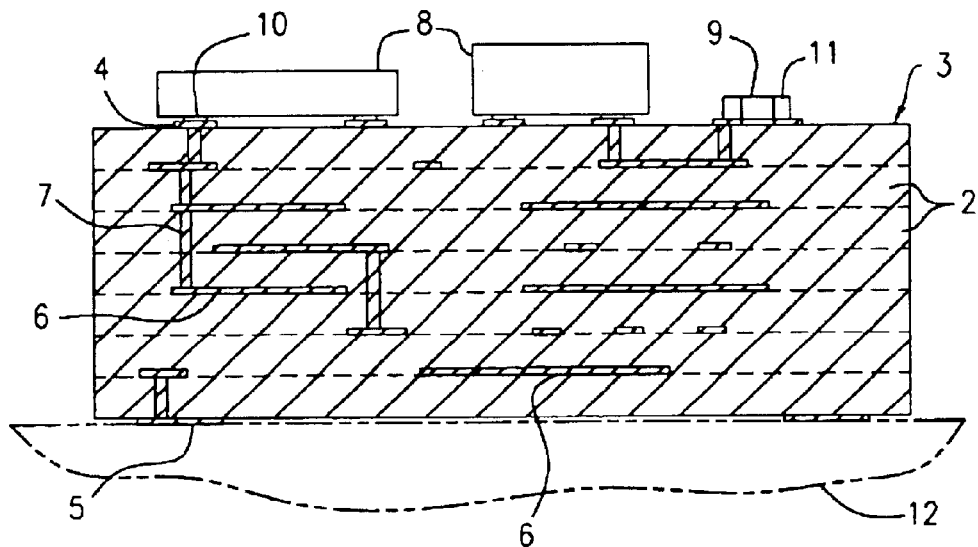
FIG. 1 is a sectional view which schematically shows a multilayered ceramic board 1 in an embodiment of the present invention.

FIG. 1 is a sectional view which schematically shows a multilayered ceramic board 1 in an embodiment of the present invention. The multilayered ceramic board 1 constitutes a ceramic multilayered module.

The multilayered ceramic board 1 includes a laminate 3 including a plurality of ceramic layers 2. In the laminate 3, various wiring conductors are provided on the ceramic layers 2.

Examples of wiring conductors include external conductive films 4 and 5 formed on end faces in the lamination direction of the laminate 3, internal conductive films 6 formed along interfaces between the ceramic layers 2, and via-hole conductors 7 formed so as to pass through specific ceramic layers 2.

The external conductive films 4 are used for connecting the external surface of the laminate 3 to electronic components 8 and 9 to be mounted thereon. FIG. 1 shows the electronic components 8 provided with bump electrodes 10, such as semiconductor devices, and the electronic component 9 provided with a sheet terminal 11, such as a chip capacitor.

The electronic components 8 are joined to the external conductive films 4 through the bump electrodes 10 by solder-reflowing, ultrasonic pressure welding, thermal compression bonding or the like. The electronic component 9 is mounted on the laminate 3 by joining the terminal 11 to the external conductive film 4, for example, using a solder or a conductive adhesive, with the terminal 11 facing the external conductive film 4.

As indicated by the phantom line in FIG. 1, the external conductive film 5 is used for connecting the multilayered ceramic board 1 to a motherboard 12 on which the multilayered ceramic board 1 is to be mounted. That is, the multilayered ceramic board 1 is mounted on the motherboard 12 while being electrically connected to the motherboard 12 through the external conductive film 5.

Figure 2:
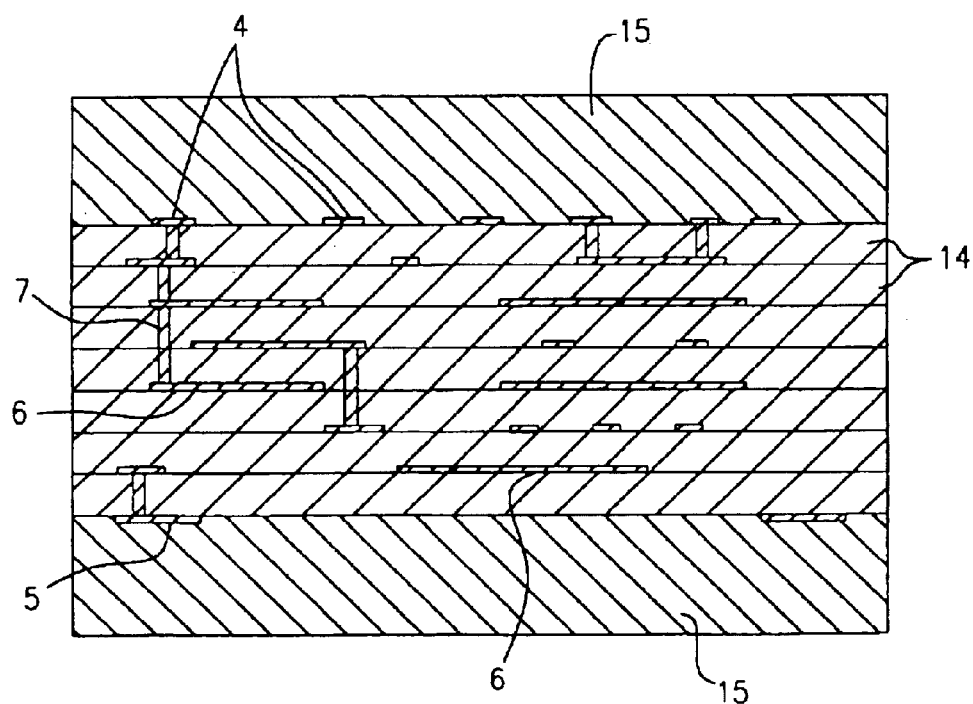
FIG. 2 is a sectional view which schematically shows a green laminate 13 prepared to produce a laminate 3 shown in FIG. 1.

The laminate 3 included in the multilayered ceramic board 1 is obtained by firing a green laminate 13 as shown in FIG. 2.

The green laminate 13 includes a plurality of green base layers 14 for forming the ceramic layers 2. The green base layers 14 contain a low-temperature sinterable ceramic material comprising a ceramic powder and a glass component, and a binder.

As the ceramic powder, for example, an alumina powder is used. The glass component contained in the low-temperature sinterable ceramic material may be a glass powder from the beginning or a glass substance may be precipitated in the firing step.

The glass component may precipitate a crystalline substance in at least the final stage of the firing step, and thereby is crystallized. As the glass component contained in the low-temperature ceramic material, for example, a borosilicate glass powder, such as forsterite, akermanite or diopside, which can precipitate a crystalline substance having small dielectric loss may be advantageously used.

The green laminate 13 is also provided with green constraining layers 15 disposed so as to be in contact with the principal surfaces of specific green base layers 14. The green constraining layer 15 contains an inorganic material powder which is not sintered at the sintering temperature of the low-temperature sinterable ceramic material. As the inorganic material powder, for example, an alumina powder may be advantageously used. In this embodiment, the green constraining layers 15 are disposed on both ends in the thickness direction of the green laminate 13.

The green laminate 13 also includes wiring conductors provided on the green base layers 14. As described above, examples of wiring conductors include the external conductive films 4 and 5, the internal conductive films 6, and the via-hole conductors 7.

In order to fabricate the green laminate 13, for example, the steps described below are carried out.

First, in order to form the green base layers 14, a binder, a dispersant, a plasticizer, an organic solvent, etc., each in an appropriate amount, are added to a mixed powder of ceramic powder and glass powder, and mixing is performed. Thereby, a ceramic slurry is produced. The ceramic slurry is then formed into a sheet by a doctor blade process or the like, and base ceramic green sheets for forming the green base layers 14 are obtained.

Next, through-holes for forming the via-hole conductors 7 are made in the base ceramic green sheets, as necessary, and by filling a conductive paste or a conductive powder into the through-holes, the via-hole conductors 7 are formed. The external conductive films 4 and 5 and internal conductive films 6 are formed on the base ceramic green sheets, as necessary, for example, by printing a silver-based conductive paste.

The base ceramic green sheets are then laminated in a predetermined order.

In order to form the green constraining layers 15, a binder, a dispersant, a plasticizer, an organic solvent, etc., each in an appropriate amount, are added to an inorganic material powder composed of alumina or the like, and mixing is performed. Thereby, inorganic material slurry is produced. The inorganic material slurry is then formed into a sheet by a doctor blade process or the like, and constraining ceramic green sheets for forming the green constraining layers 15 are obtained.

Next, the constraining ceramic green sheets are disposed on the upper and lower surfaces of the laminated base ceramic green sheets, followed by pressing. Thereby, as shown in FIG. 2, the green laminate 13 is obtained. Additionally, the green laminate 13 may be cut into an appropriate size, as necessary.

Next, the green laminate 13 is fired, for example, at 800 to 1,000° C. In the firing step, the green constraining layers 15 themselves do not substantially shrink. Consequently, the green constraining layers 15 exert force of constraint on the green base layers 14 so as to inhibit the shrinkage in the principal surface direction thereof. In the green base layers 14, the low-temperature sinterable material contained therein is sintered while shrinkage in the principal surface direction is inhibited, and shrinkage substantially occurs only in the thickness direction. Thereby, the ceramic layers 2 provided on the laminate 3 in the multilayered ceramic board 1 are formed.

This embodiment is characterized by the rate of temperature increase employed in the firing step. That is, the firing step includes a binder removal step for removing the binder contained in the green base layers 14 and the sintering step for obtaining the sintered state of the low-temperature sinterable ceramic material in which the ceramic powder is densified while the glass component is fluidized in the green base layers 14, and the rate of temperature increase from the binder removal step to the sintering step is set to be more than about 20° C./minute. By thus setting the rate of temperature increase, the following effect is achieved.

In order to produce a dense sintered state in the green base layers 14, the glass component contained in the green base layers 14 must be thoroughly fluidized so that the ceramic powder is densified. By setting the rate of temperature increase from the binder removal step to the sintering step to be more than about 20° C./minute, the viscosity of the glass component can be decreased and the fluidity can be increased at the earlier stage. Consequently, the period in which the glass component is in the fluid state is sufficiently prolonged, and the ceramic powder can be satisfactorily densified.

When the glass component precipitates a crystalline substance in at least the final stage of the sintering step, the viscosity of the glass component is increased as the crystalline substance is precipitated. As a result, the fluidity of the glass component is lost, and the ceramic powder is not easily densified. In such a case, as described above, if the rate of temperature increase is set to be more than about 20° C./minute, it is possible to satisfactorily density the ceramic powder before the glass component begins to precipitate the crystalline substance. Therefore, the densification of the ceramic powder is prevented from being inhibited by the precipitation of the crystalline substance. In this respect, the control on the rate of temperature increase is particularly effective when the glass component precipitates the crystalline substance.

After the firing step is performed, the green constraining layers 15 are removed. Since the green constraining layers 15 are not sintered, the removal can be performed easily.

The laminate 3 in the multilayered ceramic board 1 shown in FIG. 1 is thus obtained. By mounting the electronic components 8 and 9 on the external surface of the laminate 3, the multilayered ceramic board 1 as shown in FIG. 1 is completed.

In the embodiment described above, the green constraining layers 15 are disposed on both ends in the lamination direction of the green laminate 13. However, instead of or in addition to such green constraining layers 15, green constraining layers may be disposed between the green base layers 14. In the green constraining layers disposed between the green base layers 14, portions of the glass component contained in the green base layers 14 permeate in the firing step, and thereby the inorganic material powder contained therein is fixed so that the green constraining layers are solidified. Such green constraining layers are not removed after the firing step is carried out, and remain in the laminate included in the multilayered ceramic board constituting a product.

Next, an example will be described in which an experiment was performed in order to verify the effect obtained by setting the rate of temperature increase from the binder removal step to the sintering step at more than about 20° C./minute.

In this example, a green laminate 13 was formed in accordance with the fabrication method described above with reference to FIGS. 1 and 2, and a sintered laminate 3 was obtained by firing the green laminate 13, for each sample.

In the firing step, as described above, the binder removal step and the sintering step were performed in that order, and the rate of temperature increase from the binder removal step to the sintering step was changed in a range from 5° C./minute to 40° C./minute as shown in Table 1.

Low-temperature sinterable ceramic materials containing alumina powder and Si—Mg—Ca—O-based glass powder were used for the green base layers 14. As shown in Table 1, forsterite was precipitated as the crystalline substance in Sample Nos. 1 to 8, and in Sample Nos. 9 to 16, diopside was precipitated.

Alumina powder was used as the inorganic material powder contained in green constraining layers 15.

With respect to the ceramic layers 2 in the sintered laminates 3 in the individual samples, the relative density was obtained, and also the dielectric loss at 5 GHz was obtained. The relative density and the reciprocal of dielectric loss are shown in Table 1.

TABLE 1

| Sample No. | Rate of temperature increase (° C./minute) | Precipitated crystalline substance | Relative density (%) | 1/Dielectric loss 5 GHz |
|---|---|---|---|---|
| 1* | 5 | Forsterite | 85 | 150 |
| 2* | 10 | Forsterite | 88 | 180 |
| 3* | 15 | Forsterite | 90 | 230 |
| 4* | 20 | Forsterite | 93 | 290 |
| 5 | 25 | Forsterite | 96 | 500 |
| 6 | 30 | Forsterite | 97 | 650 |
| 7 | 35 | Forsterite | 98 | 700 |
| 8 | 40 | Forsterite | 98 | 680 |
| 9* | 5 | Diopside | 88 | 120 |
| 10* | 10 | Diopside | 90 | 150 |
| 11* | 15 | Diopside | 92 | 230 |
| 12* | 20 | Diopside | 93 | 240 |
| 13 | 25 | Diopside | 96 | 440 |
| 14 | 30 | Diopside | 97 | 500 |
| 15 | 35 | Diopside | 98 | 560 |
| 16 | 40 | Diopside | 98 | 570 |

Note The asterisked Sample No. corresponds to Comparative Examples out of the range of the present invention.

As shown in Table 1, in Sample Nos. 5 to 8 and 13 to 16 in which the rate of temperature increase is more than about 20° C./minute, the relative density is higher and the dielectric loss is superior in comparison with Sample Nos. 1 to 4 and 9 to 12 and the rate of temperature increase is 20° C./minute or less. Consequently, it is obvious that in Sample Nos. 5 to 8 and 13 to 16, the ceramic layers 2 are satisfactorily densified.

What is claimed is:

1. A method for fabricating a multilayered ceramic board comprising:

providing a green laminate comprising a plurality of green base layers, at least one green constraining layer disposed in contact with a principal surface of at least one of the green base layers, and at least one wiring conductor disposed on a green base layer, wherein the green base layer comprises a low-temperature sinterable ceramic material comprising a ceramic powder and a glass component which precipitates a crystalline substance selected from the group consisting of forsterite, akermanite and diopside during firing, and a binder; and the green constraining layer comprises an inorganic material powder which is not sintered at the sintering temperature of the low-temperature sinterable ceramic material; and firing the green laminate at the sintering temperature for the low-temperature sinterable ceramic material, wherein the firing comprises binder removal for removing the binder contained in the green base layers and sintering for obtaining the sintered state of the low-temperature sinterable ceramic material in which the ceramic powder is densified while the glass component is fluidized in the green base layer, and wherein the rate of temperature increase from the binder removal to the sintering is more than about 20° C./minute so as to precipitate the forsterite, akermanite or diopside.

2. A method for fabricating a multilayered ceramic board according to claim 1, wherein green constraining layers are disposed on both ends in the lamination direction of the laminate, and the method further comprises removing the green constraining layers disposed on both ends in the lamination direction of the laminate after the firing.

3. A method for fabricating a multilayered ceramic board according to claim 2, further comprising mounting an electronic component on an external surface of the laminate after the firing.

4. A method for fabricating a multilayered ceramic board according to claim 3, wherein the rate of temperature increase from the binder removal to the sintering is at least 25° C./minute.

5. A method for fabricating a multilayered ceramic board according to claim 4, wherein the glass precipitates the crystalline substance before the firing is complete.

6. A method for fabricating a multilayered ceramic board according to claim 5, wherein the glass is a borosilicate glass.

7. A method for fabricating a multilayered ceramic board according to claim 1, wherein the rate of temperature increase from the binder removal to the sintering is at least 25° C./minute.

8. A method for fabricating a multilayered ceramic board according to claim 1, wherein the glass precipitates the crystalline substance before the firing is complete.

9. A method for fabricating a multilayered ceramic board according to claim 8, wherein glass is a borosilicate glass.

10. A method for fabricating a multilayered ceramic board according to claim 1, further comprising forming said green laminate.

* * * * *